United States Patent [19]

Saito et al.

[11] Patent Number: 4,562,409

[45] Date of Patent: Dec. 31, 1985

[54] CAVITY RESONATOR COUPLING-TYPE POWER DISTRIBUTOR/POWER COMBINER

[75] Inventors: Toshiyuki Saito; Naofumi Okubo, both of Kawasaki; Yoshiaki Kaneko, Yokohama, all of Japan

[73] Assignee: Fujitsu Limited, Kawasaki, Japan

[21] Appl. No.: 593,429

[22] Filed: Mar. 26, 1984

[30] Foreign Application Priority Data

Mar. 29, 1983 [JP] Japan ................................ 58-53259

[51] Int. Cl.[4] ........................... H03F 3/60; H01P 5/12

[52] U.S. Cl. .................................... 330/286; 330/295; 333/137; 333/227; 333/230

[58] Field of Search ............... 333/137, 125, 126, 135, 333/227, 230, 212; 330/286, 287, 295; 331/56

[56] References Cited

U.S. PATENT DOCUMENTS 2,550,524 4/1951 Braden ........................... 333/125 X
2,659,031 11/1953 Bokhove ......................... 333/230 X
3,290,682 12/1966 Ajioka ............................ 333/137 X
3,873,935 3/1975 Oltman, Jr. ......................... 330/287
4,035,746 7/1977 Covington, Jr. ................ 333/125 X
4,147,994 4/1979 Thoren et al. ........................ 331/56
4,175,257 11/1979 Smith et al. ......................... 330/287
4,238,747 12/1980 Harp et al. ...................... 330/287 X

*Primary Examiner*—Paul Gensler
*Attorney, Agent, or Firm*—Staas & Halsey

[57] ABSTRACT

A cavity resonator coupling-type power distributor/-power combiner includes a first cavity resonator operatively resonating with a cylindrical $T_{O,n,O}$ mode, and a plurality of second cavity resonators arranged on the periphery of the first cavity resonator and extending radially and symmetrically with respect to the first cavity resonator. The second cavity resonators each have the same shape and size so that magnetic-field coupling is established between the first cavity resonator and each of the second cavity resonators, for distributing or combining microwave power in a microwave amplifier.

37 Claims, 8 Drawing Figures

CAVITY RESONATOR COUPLING-TYPE POWER DISTRIBUTOR/POWER COMBINER

CROSS REFERENCE TO RELATED APPLICATION

This application is related to application Ser. No. 571,811, filed Jan. 18, 1984, having the same inventors and assigned to the same assignee.

BACKGROUND OF THE INVENTION

1. Field of the Invention

The present invention relates to a cavity resonator coupling-type power distributor/power combiner. More particularly, it relates to a distributor/combiner of a cavity resonator coupling-type for distributing or combining microwave electric power between a single coupling terminal and a plurality of coupling terminals.

2. Description of the Prior Art

In recent years, attempts have been made to use semi-conductor amplifier elements, such as gallium-arsenide (GaAs) field effect transistors (FET's) instead of conventional traveling-wave tubes to amplify signals in the microwave band. The semi-conductor amplifier element, however, has an output power of several watts at the greatest, and when it is necessary to amplify a high frequency signal with a large electric power, such elements must be operated in parallel. Because of this, a conventionally accepted practice is to distribute input signals in the microwave band into a plurality of channels by a microwave distributor, to amplify the signals of each channel by one of the above-mentioned semi-conductor amplifier elements, and to combine the amplified output signals of each of the channels into a signal of one channel by a microwave combiner, thereby obtaining a high frequency signal with large electric power. The electric power, however, is lost when the phases and the amplitudes of the microwave electric power distributed by the microwave distributor are not in agreement, or when the microwave electric power is not combined in phase and in equal amplitude by the microwave combiner. It is, therefore, desired that the phases and the amplitudes of microwave signals should be uniformly distributed in the microwave distributor and in the microwave combiner. It is also necessary that the distributor and the combiner lose as little electric power as possible.

Hybrid junction circuits are conventionally used for distributing or combining microwave electric power. The hybrid junction circuits, however, have disadvantages in that considerable insertion loss occurs therein and they require a relatively large area due to the microstrip lines constituting the hybrid junction circuits.

A cavity resonator may be effectively used as a distributor or a combiner because it can provide a high coincidence of both phase and electric power between the input and the output thereof. Conventionally, only a single cavity resonator is present. A single cavity resonator, however, has a very narrow bandwidth which limits its use as a distributor or a combiner. Therefore, a single cavity resonator cannot be practically used as a distributor or a combiner.

SUMMARY OF THE INVENTION

An object of the present invention is to provide a cavity resonator coupling-type power distributor/power combiner which can distribute or combine microwave electric power over a wide bandwidth with a small insertion loss.

Another object of the present invention is to provide a cavity resonator coupling-type power distributor/power combiner in which a single cavity resonator and a plurality of cavity resonators are magnetically coupled.

Still another object of the present invention is to provide a microwave power amplifier consisting of a cavity resonator coupling-type power distributor and a plurality of amplifying units, for amplifying microwave electric power over a wide bandwidth, and with a small insertion loss.

A still further object of the present invention is to provide a microwave power amplifier consisting of a plurality of amplifying units and a cavity resonator coupling-type power combiner, for combining the outputs of the amplifying units over a wide bandwidth, and with a small insertion loss.

Yet another object of the present invention is to provide a microwave power amplifier consisting of a cavity resonator coupling-type power distributor, a plurality of amplifying units for amplifying the outputs of the distributor, and a cavity resonator coupling-type power combiner for combining the outputs of the amplifying units, the distribution and the combination being carried out for a wide bandwidth with a small insertion loss.

To attain the above objects, there is provided, according to the present invention, a cavity resonator coupling-type power distributor/power combiner which includes a first conducting means having an input/output end for receiving or providing input/output signals of microwave electric power and a first cavity resonator having a symmetric shape with respect to an axis thereof and operatively resonating with a cylindrical $TM_{0,n,0}$ mode, where n is a positive integer. An electric-field coupling is operatively established between the first conducting means and the first cavity resonator through an antenna. A plurality of second cavity resonators are arranged on the periphery of the first cavity resonator and extend radially and symmetrically with respect to the axis of the first cavity resonator. The second cavity resonators have the same shape and size as each other and magnetic-field coupling is operatively established between each of the second cavity resonators and the first cavity resonator. A plurality of second conducting means having output/input ends are coupled with the second cavity resonators for conducting output/input signals of microwave electric power between the second cavity resonators and the output/input ends of the second conducting means.

BRIEF DESCRIPTION OF THE DRAWINGS

The above objects and features as well as other features and advantages of the present invention will be more apparent from the following description of the preferred embodiments with reference to the accompanying drawings, wherein.

DESCRIPTION OF THE PREFERRED EMBODIMENTS

Before describing the preferred embodiments of the present invention, conventional microwave power amplifiers will first be described with reference to FIGS. 1 and 2.

Figure 1:
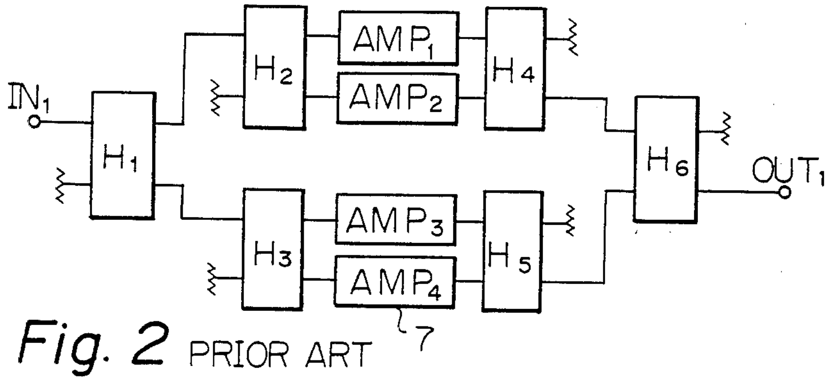
Fig. 1 PRIOR ART
FIG. 1 is a block diagram of a conventional microwave power amplifier employing hybrid junction circuits.

FIG. 1 is a block circuit diagram of an example of a conventional microwave power amplifier employing hybrid junction circuits. In FIG. 1, a hybrid circuit $H_1$ receives microwave input signals at its input terminal $IN_1$ and branches them into two pathways. The branched signals on one pathway and on the other pathway are received by hybrid junction circuits $H_2$ and $H_3$, respectively. The hybrid junction circuits $H_2$ and $H_3$ further branch the input signals into two more pathways each. Amplifying units $AMP_1$ through $AMP_4$ receive the branched signals from the hybrid junction circuits $H_2$ and $H_3$ and amplify them. The amplified signals from the amplifying units $AMP_1$ and $AMP_2$ are combined by a hybrid junction circuit $H_4$. The amplified signals from the amplifying units $AMP_3$ and $AMP_4$ are combined in a hybrid junction circuit $H_5$. The combined signals from the hybrid junction circuits $H_4$ and $H_5$ are further combined by a hybrid junction circuit $H_6$. Thus, a desired microwave power is output from an output terminal $OUT_1$.

To obtain a higher microwave power, a larger number of amplifying units should be operated in parallel. To achieve this, a larger number of stages of hybrid junction circuits are necessary.

There are disadvantages in the conventional microwave power amplifier employing hybrid junction circuits. One disadvantage is that each hybrid junction circuit has a high insertion loss so that a number of stages of the hybrid junction circuits have a relatively large insertion loss. Another disadvantage is that each hybrid junction circuit is usually constructed by microstrip lines which occupy a large area, so that a number of stages of the hybrid junction circuits occupy a relatively large area, resulting in a microwave power amplifier having a large size.

Figure 2:
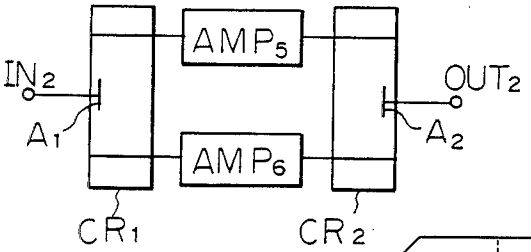
Fig. 2 PRIOR ART
FIG. 2 is a block diagram of a conventional microwave power amplifier employing cavity resonators.

FIG. 2 shows another example of a conventional microwave power amplifier employing cavity resonators. In FIG. 2, two amplifying units $AMP_5$ and $AMP_6$ are connected between a first cavity resonator $CR_1$ and a second cavity resonator $CR_2$. The first cavity resonator $CR_1$ receives microwave input signals at its input terminal $IN_2$, and functions as a distributor. The second cavity resonator $CR_2$ provides desired output signals at its output terminal $OUT_2$, functioning as a combiner. Between the input terminal $IN_2$ and the first cavity resonator $CR_1$, electric-field coupling is established by means of a disk-type antenna $A_1$. Also, between the second cavity resonator $CR_2$ and the output terminal $OUT_2$, electric-field coupling is established by means of a disk type antenna $A_2$. Between the outputs of the first cavity resonator $CR_1$ and the inputs of the amplifying units $AMP_5$ and $AMP_6$, and between the outputs of the amplifying units $AMP_5$ and $AMP_6$ and the inputs of the second cavity resonator $CR_2$, magnetic-field coupling is established. By forming a plurality of magnetic-field coupling loops in the first and the second cavity resonators $CR_1$ and $CR_2$, it is easy to distribute or to combine microwave signals with a small insertion loss.

However, since the first cavity resonator $CR_1$ or the second cavity resonator $CR_2$ is a single cavity resonator, and since a single cavity resonator can, by its character, deal with only a very narrow bandwidth of microwave electric power, the conventional amplifier in FIG. 2 cannot be used for distributing and combining a wide bandwidth of microwave electric power.

Figure 3:
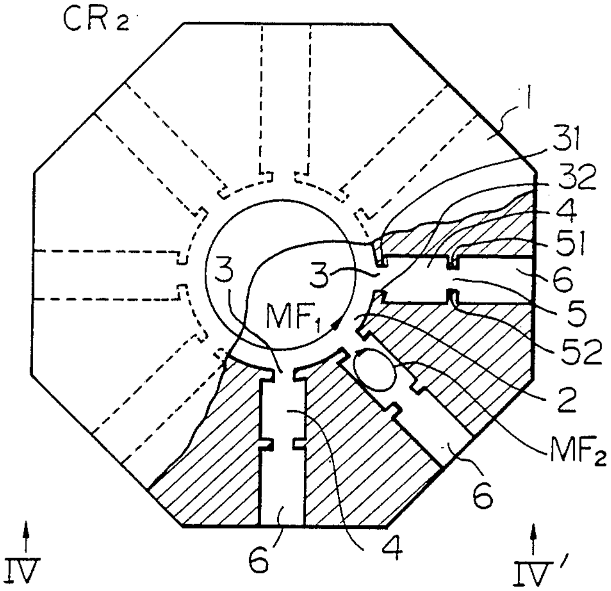
FIG. 3 is a partially cut top plan view of a cavity resonator coupling-type power distributor/power combiner, according to an embodiment of the present invention.
Figure 4:
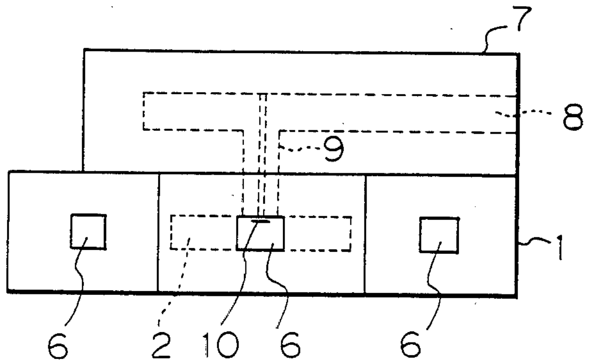
FIG. 4 is a side view from the direction of the arrows IV—IV' in FIG. 3.

Embodiments of the present invention will now be described. FIG. 3 is a partially cut top plan view of a cavity resonator coupling-type power distributor/-power combiner, according to an embodiment of the present invention. FIG. 4 is a side view from the direction of the arrows IV—IV' in FIG. 3. In FIGS. 3 and 4, the cavity resonator coupling-type power distributor/-power combiner distributes input signals into eight outputs or combines eight inputs into one output, and comprises a resonator body 1 having an octagonal cross section with a cylindrical cavity, a first cavity resonator 2 formed by the cylindrical cavity, windows 3 for establishing magnetic-field coupling, second cavity resonators 4, windows 5 for establishing magnetic-field coupling, output/input waveguides 6, an input/output part 7, an input/output waveguide 8, a coaxial line 9 combined with the input/output waveguide 8, and an antenna 10 establishing electric field coupling.

The first cavity resonator 2 is formed by the cylindrical cavity formed within the central portion of the resonator body 1. The antenna 10 is provided in the first cavity resonator 2 and at the central portion of the upper surface of the first cavity resonator 2. The antenna 10 is connected to the inner conductor of the coaxial line 9 and operatively establishes an electric-field coupling with the first cavity resonator 2. The first cavity resonator 2 operatively resonates with a cylindrical $TM_{0,n,0}$ mode, where n is a positive integer, resulting in a circular magnetic field $MF_1$ as indicated in FIG. 3 by a circle.

Each of the eight second cavity resonators 4 is constructed by a corresponding window 3, a corresponding window 5, and a cavity formed between them. The second cavity resonators 4 are arranged on the periphery of the first cavity resonator 2 and extend radially and symmetrically with respect to the axis of the cylindrical shape of the first cavity resonator 2. The second cavity resonators 4 have the same shape and size. In this embodiment and in the other embodiments, the cavity in each of the second cavity resonators 4 is a rectangular solid which is a part of a waveguide.

Each of the windows 3 and 5 is indicated, in FIG. 3, by two opposite projections 31 and 32, and 51 and 52 at the inner wall of the waveguide forming each of the second cavity resonators 4. The size of each window 3 or 5 is smaller than the size of the cross-sectional area of the waveguide. Magnetic-field coupling is operatively established between the first cavity resonator 2 and each of the second cavity resonators 4, by means of the windows 3 between the first cavity resonator 2 and the second cavity resonators 4, resulting in a magnetic field $MF_2$ in each of the second cavity resonators 4. Thus, each of the second cavity resonators 4 having a rectangular cross-section resonates with, for example, $TE_{101}$ mode, $TE_{102}$ mode, or other modes. If the cavity in each of the second cavity resonators 4 has a circular cross-section, the resonating mode will be, for example, $TE_{111}$ mode.

Magnetic-field coupling is operatively established between each of the second cavity resonators 4 and the corresponding one of the output/input waveguides 6, by means of the windows 5 between the second cavity resonators 4 and the corresponding waveguides 6. Electric-field coupling may alternatively be established by appropriately forming the windows 5.

When the device illustrated in FIGS. 3 and 4 is used as a power distributor, the output/input waveguides 6 act as output waveguides, and the input/output waveguide 8 acts as an input waveguide. That is, microwave power input into the input waveguide 8 is supplied through the coaxial line 9 to the antenna 10. The input microwave power is transferred to the first cavity resonator 2 by the electric-field coupling between the antenna 10 and the first cavity resonator 2. The microwave power in the first cavity resonator 2 is divided and transferred to the eight second cavity resonators 4 by the magnetic-field coupling between the first cavity resonator 2 and the second cavity resonators 4 by the windows 3. The divided microwave power in the second cavity resonators 4 is transferred through the windows 5 to the output waveguides 6. The output power from the output waveguides 6 is supplied to the respective amplifying units (not shown in FIGS. 3 and 4).

On the contrary, when the device in FIGS. 3 and 4 is used as a power combiner, the output/input waveguides 6 act as input waveguides, and the input/output waveguide 8 acts as an output waveguide. That is, when microwave signals respectively amplified by eight amplifying units (not shown in FIGS. 3 and 4) are applied to the input waveguides 6, the microwave power in these input waveguides 6 is transferred through the windows 5, and through the second cavity resonators 4, and combined in the first cavity resonator 2 by the magnetic-field coupling. The combined microwave power in the first cavity resonator 2 is then transferred through the coaxial line 9 to the output waveguide 8 by the electric-field coupling between the first cavity resonator 2 and the coaxial line 9 provided by the antenna 10. Thus, combined microwave power is obtained at the end of the output waveguide 8.

Since the first cavity resonator 2 has a cylindrical shape, it can be easily manufactured by milling. Also, since the second cavity resonators 4 are formed in one body with the first cavity resonator 2 and extend radially and symmetrically with respect to the axis of the circular cross-section of the first cavity resonator 2, the second cavity resonators 4 can be manufactured easily.

Figure 5:
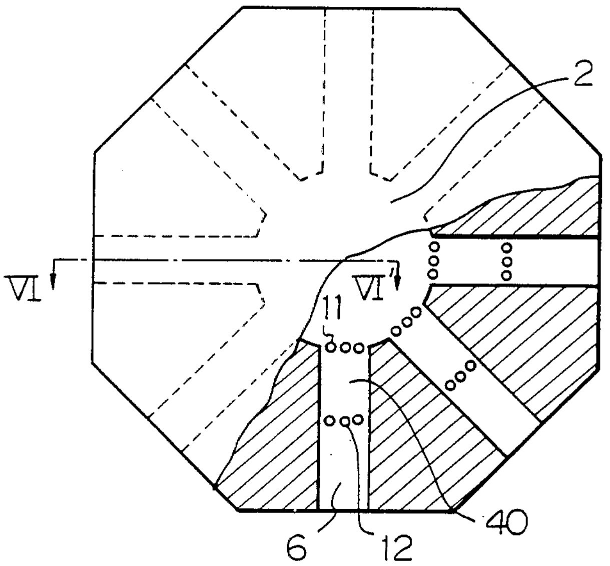
FIG. 5 is a partially cut top plan view of a cavity resonator coupling-type power distributor/power combiner, according to another embodiment of the present invention.
Figure 6:
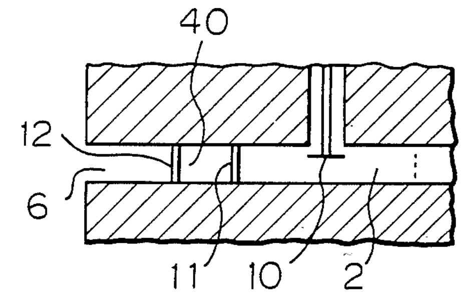
FIG. 6 is a partial cross-sectional view taken along line VI—VI' in FIG. 5.

FIG. 5 is a partially cut top plan view of a cavity resonator coupling type power distributor/power combiner, according to another embodiment of the present invention, and FIG. 6 is a partial cross-sectional view taken along line VI—VI' in FIG. 5. The difference between the embodiment shown in FIGS. 3 and 4 and the embodiment in FIGS. 5 and 6 is that, in place of the windows 3 and 5 shown in FIGS. 3 and 4, a first set of electrically conductive posts 11 and a second set of electrically conductive posts 12 are provided on both sides of each of the second cavity resonators 40. These sets of conductive posts also function to establish a magnetic-field coupling between the first cavity resonator 2 and the second cavity resonators 40, and between the second cavity resonators 40 and the output/input waveguides 6. The embodiment shown in FIGS. 5 and 6 has an advantage over the first embodiment shown in FIGS. 3 and 4 in that, since none of the second cavity resonators 40 need to be provided with the opposite projections for forming the windows 3 and 5 as in FIGS. 3 and 4, the second cavity resonators 40 can be easily manufactured because the size of the cross-section of each of the second cavity resonators 40 is the same as the size of the cross-section of each of the waveguides 6 at all places in the second cavity resonators 40.

Figure 7:
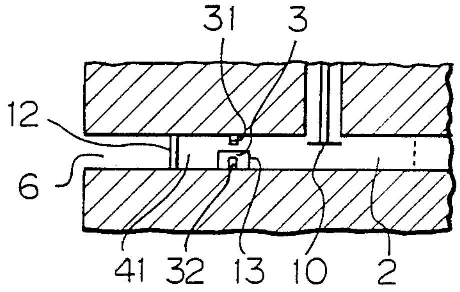
FIG. 7 is a partial cross-sectional view of a cavity resonator coupling-type power distributor/power combiner, according to still another embodiment of the present invention.

FIG. 7 is a partial cross-sectional view of a cavity resonator coupling-type power distributor/power combiner, according to still another embodiment of the present invention. The difference between the embodiment shown in FIGS. 5 and 6 and the embodiment in FIG. 7 is that, in place of the conductive posts 11 in FIGS. 5 and 6, opposite projections 31 and 32 are illustrated as forming the windows 3 between the first cavity resonator 2 and each of the second cavity resonators 41, in a manner similar to the first embodiment shown in FIGS. 3 and 4, and a conductive wire 13 is provided between the first cavity resonator 2 and each of the second cavity resonators 41 through the window 3. The conductive wire 13 is used to adjust the coupling coefficient between the first cavity resonator 2 and each of the second cavity resonators 41.

Figure 8:
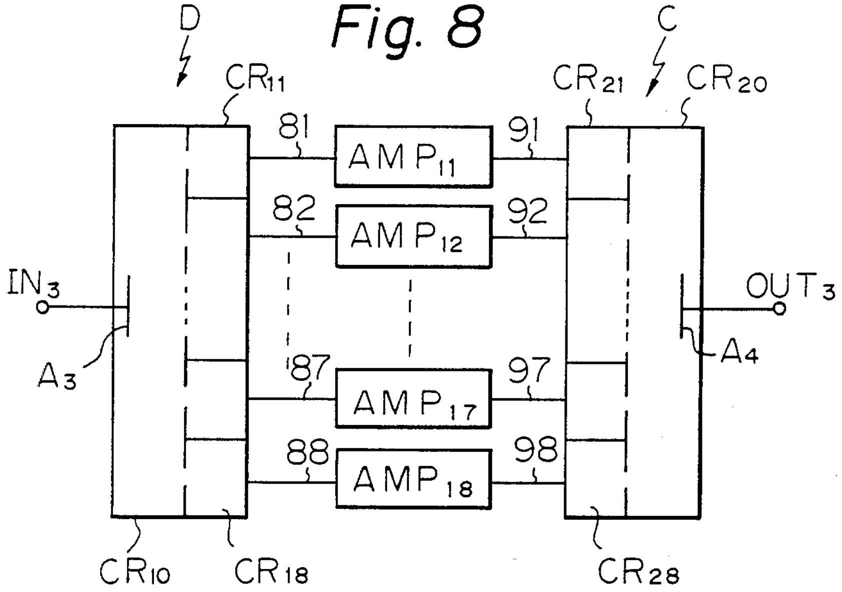
FIG. 8 is a block diagram of a microwave power amplifier employing a cavity resonator coupling-type power distributor and a cavity resonator coupling type power combiner of any one of the embodiments shown in FIGS. 3, 5 and 7.

FIG. 8 is a block circuit diagram of a microwave power amplifier employing a cavity resonator coupling-type power distributor and a cavity resonator coupling-type power combiner of any one of the embodiments shown in FIGS. 3, 5 and 7. In FIG. 8, eight amplifying units $AMP_{11}$ through $AMP_{18}$ are connected between cavity resonators $CR_{11}$ through $CR_{18}$ and cavity resonators $CR_{21}$ through $CR_{28}$. The former cavity resonators $CR_{11}$ through $CR_{18}$ are in magnetic-field coupling with a cavity resonator $CR_{10}$. The cavity resonators $CR_{21}$ through $CR_{28}$ are in magnetic-field coupling with a cavity resonator $CR_{20}$. The cavity resonator $CR_{10}$ and the cavity resonators $CR_{11}$ through $CR_{18}$ constitute a divider D for dividing microwave power applied to an antenna $A_3$ provided in the cavity resonator $CR_{10}$, into eight microwave outputs. The outputs of the divider D are amplified by the amplifiers $AMP_{11}$ through $AMP_{18}$, respectively. The outputs of the amplifiers $AMP_{11}$ through $AMP_{18}$ are combined by a combiner C consisting of the cavity resonators $CR_{21}$ through $CR_{28}$ and the cavity resonator $CR_{20}$. Thus, a combined output is obtained at an output terminal $OUT_3$ through an antenna $A_4$ in the cavity resonator $CR_{20}$.

The amplifiers $AMP_{11}$ through $AMP_{18}$ are constructed by a microwave integrated circuit (MIC) having input lines 81 through 88 and output lines 91 through 98. These input lines and output lines are formed by microstrip lines. Electromagnetic-field coupling between the cavity resonators $CR_{11}$ through $CR_{18}$ and the input microstrip lines 81 through 88 can be easily established by those skilled in the art. For example, by connecting additional waveguides to the output waveguides 6 (FIG. 3), and by bending the additional waveguides toward the MIC including the amplifying units, the additional waveguides can be electromagnetically coupled with the input microstrip lines 81 through 88 by means of MIC antennas provided at the boundary ends of the input microstrip lines between the output waveguides 6 and the input microstrip lines. Similarly, between the output microstrip lines 91 through 98 and the cavity resonator $CR_{21}$ through $CR_{28}$, electromagnetic-field coupling can also be established easily.

In place of using the input/output waveguides 6 for establishing electromagnetic-field coupling between the cavity resonators $CR_{11}$ through $CR_{18}$ and the input microstrip lines 81 through 88, or between the cavity resonators $CR_{21}$ through $CR_{28}$ and the output microstrip lines 91 through 98, coaxial cables may alternatively be employed. That is, by introducing antennas connected to coaxial cables into the second cavity resonators 4 (FIG. 3), the second cavity resonators 4 can be coupled with the coaxial cables. Thus, the input/output microwave power can be transferred through the coaxial cables and through the input/output microstrip lines into or from the amplifying units $AMP_{11}$ through $AMP_{18}$.

From the foregoing description, it will be apparent that, according to the present invention, since only cavity resonators are employed and no hybrid junction circuit is employed, insertion loss can be greatly decreased in a power distributor/power divider. Also, since the first cavity resonator and the second cavity resonators are coupled in a magnetic field to form a double cavity resonator, the power distributor/power combiner can distribute or combine microwave electric power over a much wider bandwidth in comparison with the prior art employing a single cavity resonator. Further, by forming the windows 3 as small as possible or by providing an appropriate number of posts 11 and 12, any undesired mode in the second cavity resonators can be limited so that the distribution or combination of microwave electric power can be stably carried out. Still further, the cavity resonator coupling-type power distributor/power combiner according to the present invention has a simple structure and a small size.

As will be apparent, the cavity resonator coupling-type power distributor/power combiner can be effectively used with a number of amplifying units to form a microwave amplifier.

It should be noted that the present invention is not restricted to the foregoing embodiments. Various changes and modifications are possible without departing from the spirit of the present invention. For example, the number of second cavity resonators may be more or less than eight.

We claim:

1. A cavity resonator coupling-type power distributor/power combiner, comprising:
- first conducting means, having an input/output end and an antenna, for conducting input/output signals of microwave electric power;
- a first cavity resonator, operatively coupled to the antenna of said first conducting means by electric field coupling, having an axis and a symmetric shape with respect to the axis and resonating with a cylindrical $TM_{0,n,0}$ mode, where n is a positive integer;
- a plurality of second cavity resonators arranged on the periphery of and operatively coupled by magnetic-field coupling to said first cavity resonator and extending radially and symmetrically with respect to the axis of said first cavity resonator, each of said second cavity resonators having the same shape and size and each of said second cavity resonators comprising:
  - a cavity formed by a waveguide;
  - a first window formed between said first cavity resonator and said cavity, for establishing magnetic-field coupling therebetween; and
  - a second window formed in the waveguide opposite said first window; and
- a plurality of second conducting means having output/input ends, each of said second conducting means operatively coupled to a corresponding one of said second cavity resonators via said second window of the corresponding one of said second cavity resonators, which establishes electromagnetic-field coupling therebetween, for conducting output/input signals of microwave electric power between said second cavity resonators and the output/input ends of said second conducting means.

2. A cavity resonator coupling-type power distributor/power combiner as set forth in claim 1, wherein said first cavity resonator has a cylindrical shape.

3. A cavity resonator coupling-type power distributor/power combiner as set forth in claim 1, wherein each of said second conducting means comprises the waveguide and has a cross-sectional area larger than said first window and said second window.

4. A cavity resonator coupling-type power distributor/power combiner, comprising:
- first conducting means, having an input/output end and an antenna, for conducting input/output signals of microwave electric power;
- a first cavity resonator, operatively coupled to the antenna of said first conducting means by electric field coupling, having an axis and a symmetric shape with respect to the axis and resonating with a cylindrical $TM_{0,n,0}$ mode, where n is a positive integer;
- a plurality of second cavity resonators arranged on the periphery of and operatively coupled by magnetic-field coupling to said first cavity resonator and extending radially and symmetrically with respect to the axis of said first cavity resonator, each of said second cavity resonators having the same shape and size and each of said second cavity resonators comprising:
  - a cavity formed by a waveguide;
  - a first set of electrically conductive posts, arranged between said first cavity resonator and said cavity, for establishing magnetic-field coupling therebetween; and
  - a second set of electrically conductive posts, arranged in the waveguide opposite said first set of electrically conductive posts; and
- a plurality of second conducting means having output/input ends, each of said second conducting means operatively coupled to a corresponding one of said second cavity resonators via said second set of electrically conductive posts in the corresponding one of said second cavity resonators, which establishes electromagnetic-field coupling therebetween, for conducting output/input signals of microwave electric power between said second cavity resonators and the output/input ends of said second conducting means.

5. A cavity resonator coupling-type power distributor/power combiner as set forth in claim 4, wherein each of said second conducting means comprises the waveguide.

6. A cavity resonator coupling-type power distributor/power combiner as set forth in claim 4, wherein said first cavity resonator has a cylindrical shape.

7. A cavity resonator coupling-type power distributor/power combiner, comprising:

first conducting means, having an input/output end and an antenna, for conducting input/output signals of microwave electric power;

a first cavity resonator, operatively coupled to the antenna of said first conducting means by electric field coupling, having an axis and a symmetric shape with respect to the axis and resonating with a cylindrical $TM_{0,n,0}$ mode, where n is a positive integer;

a plurality of second cavity resonators arranged on the periphery of and operatively coupled by magnetic-field coupling to said first cavity resonator and extending radially and symmetrically with respect to the axis of said first cavity resonator, each of said second cavity resonators having the same shape and size and each of said second cavity resonators comprising:

a cavity formed by a waveguide;

a window, formed between said first cavity resonator and said cavity, for establishing magnetic-field coupling therebetween; and a set of electrically conductive posts, arranged in the waveguide opposite said window; and a plurality of second conducting means having output/input ends, each of said second conducting means operatively coupled to a corresponding one of said second cavity resonators via said set of electrically conductive posts in the corresponding one of said second cavity resonators, which establishes electromagnetic-field coupling therebetween, for conducting output/input signals of microwave electric power between said second cavity resonators and the output/input ends of said second conducting means.

8. A cavity resonator coupling-type power distributor/power combiner as set forth in claim 7, further comprising conductive lines, each of said conductive lines operatively connected between said first cavity resonator and one of said second cavity resonators through said window of the one of said second cavity resonators, for adjusting the magnetic-field coupling.

9. A cavity resonator coupling-type power distributor/power combiner as set forth in claim 7, wherein said first cavity resonator has a cylindrical shape.

10. A microwave power amplifier, comprising:

a cavity resonator coupling-type power distributor, comprising:

first conducting means, having an input end and an antenna, for receiving input signals of microwave electric power;

a first cavity resonator, operatively coupled to the antenna of said first conducting means by electric-field coupling, having an axis and a symmetric shape with respect to the axis and resonating with a cylindrical $TM_{0,n,0}$ mode, where n is a positive integer;

a plurality of second cavity resonators arranged on the periphery of and magnetically coupled to said first cavity resonator and extending radially and symmetrically with respect to the axis of said first cavity resonator, each of said second cavity resonators having the same shape and size and each of said second cavity resonators comprising:

a cavity formed by a waveguide;

a first window formed between said first cavity resonator and said cavity, for establishing magnetic-field coupling therebetween; and a second window formed in the waveguide opposite said first window; and a plurality of second conducting means having output ends, each of said second conducting means operatively coupled to a corresponding one of said second cavity resonators via said second window of the corresponding one of said second cavity resonators, which establishes electromagnetic-field coupling therebetween, for conducting output signals of microwave electric power from said second cavity resonators to the output ends of said second conducting means; and amplifying units, having input terminals operatively connected to the output ends of said second conducting means, for receiving and amplifying the output signals.

11. A microwave power amplifier as set forth in claim 10, wherein said first cavity resonator has a cylindrical shape.

12. A microwave power amplifier as set forth in claim 10, wherein each of said second conducting means comprises said waveguide which has a cross-sectional area larger than said first window and said second window.

13. A microwave power amplifier, comprising:

a cavity resonator coupling-type power distributor, comprising:

first conducting means, having an input end and an antenna, for receiving input signals of microwave electric power;

a first cavity resonator, operatively coupled to the antenna of said first conducting means by electric-field coupling, having an axis and a symmetric shape with respect to the axis and resonating with a cylindrical $TM_{0,n,0}$ mode, where n is a positive integer;

a plurality of second cavity resonators arranged on the periphery of and magnetically coupled to said first cavity resonator and extending radially and symmetrically with respect to the axis of said first cavity resonator, each of said second cavity resonators having the same shape and size and each of said second cavity resonators comprising:

a cavity formed by a waveguide;

a first set of electrically conductive posts, arranged between said first cavity resonator and said cavity, for establishing magnetic-field coupling therebetween; and a second set of electrically conductive posts, arranged in the waveguide opposite said first set of electrically conductive posts; and a plurality of second conducting means having output ends, each of said second conducting means operatively coupled to a corresponding one of said second cavity resonators via said second set of electrically conductive posts in the corresponding one of said second cavity resonators, which establishes electromagnetic-field coupling therebetween, for conducting output signals of microwave electric power from said second cavity resonators to the output ends of said second conducting means; and amplifying units, having input terminals operatively connected to the output ends of said second conducting means, for receiving and amplifying the output signals.

14. A microwave power amplifier as set forth in claim 13, wherein each of said second conducting means comprises said waveguide.

15. A microwave power amplifier as set forth in claim 13, wherein said first cavity resonator has a cylindrical shape.

16. A microwave power amplifier, comprising:

a cavity resonator coupling-type power distributor, comprising:

first conducting means, having an input end and an antenna, for receiving input signals of microwave electric power;

a first cavity resonator, operatively coupled to the antenna of said first conducting means by electric-field coupling, having an axis and a symmetric shape with respect to the axis and resonating with a cylindrical $TM_{0,n,0}$ mode, where n is a positive integer;

a plurality of second cavity resonators arranged on the periphery of and magnetically coupled to said first cavity resonator and extending radially and symmetrically with respect to the axis of said first cavity resonator, each of said second cavity resonators having the same shape and size and each of said second cavity resonators comprising:

a cavity formed by a waveguide;

a window, formed between said first cavity resonator and said cavity, for establishing magnetic-field coupling therebetween; and a set of electrically conductive posts, arranged in the waveguide opposite said window; and a plurality of second conducting means having output ends, each of said second conducting means operatively coupled to a corresponding one of said second cavity resonators via said set of electrically conductive posts in the corresponding one of said second cavity resonators, which establishes electromagnetic-field coupling therebetween, for conducting output signals of microwave electric power from said second cavity resonators to the output ends of said second conducting means; and amplifying units, having input terminals operatively connected to the output ends of said second conducting means, for receiving and amplifying the output signals.

17. A microwave power amplifier as set forth in claim 16, further comprising conductive lines, each of said conductive lines connected between said first cavity resonator and one of said second cavity resonators through said window of the one of said second cavity resonators, for adjusting the magnetic-field coupling.

18. A microwave power amplifier as set forth in claim 16, wherein said first cavity resonator has a cylindrical shape.

19. A microwave power amplifier, comprising:

a plurality of amplifying units having output terminals; and a cavity resonator coupling-type power combiner, comprising:

first conducting means, having an output end and an antenna, for providing output signals of microwave electric power;

a first cavity resonator, operatively coupled to the antenna of said first conducting means by electric-field coupling, having an axis and a symmetric shape with respect to the axis and resonating with a cylindrical $TM_{0,n,0}$ mode , where n is a positive integer;

a plurality of second cavity resonators arranged on the periphery of and magnetically coupled to said first cavity resonator and extending radially and symmetrically with respect to the axis of said first cavity resonator, each of said second cavity resonators having the same shape and size and each of said second cavity resonators comprising:

a cavity formed by a waveguide;

a first window formed between said first cavity resonator and said cavity, for establishing magnetic-field coupling therebetween; and a second window formed in the waveguide opposite said first window; and a plurality of second conducting means having input ends operatively connected to the output terminals of said amplifying units, each of said second conducting means operatively coupled to a corresponding one of said second cavity resonators via said second window of the corresponding one of said second cavity resonators, which establishes electromagnetic-field coupling therebetween, for conducting input signals of microwave electric power from said amplifying units into said second cavity resonators through the input ends of said second conducting means.

20. A microwave power amplifier as set forth in claim 19, wherein said first cavity resonator has a cylindrical shape.

21. A microwave power amplifier as set forth in claim 19, wherein each of said second conducting means comprises said waveguide, which has a cross-sectional area larger than said first window and said second window.

22. A microwave power amplifier, comprising:

a plurality of amplifying units having output terminals; and a cavity resonator coupling-type power combiner, comprising:

first conducting means, having an output end and an antenna, for providing output signals of microwave electric power;

a first cavity resonator, operatively coupled to the antenna of said first conducting means by electric-field coupling, having an axis and a symmetric shape with respect to the axis and resonating with a cylindrical $TM_{0,n,0}$ mode, where n is a positive integer;

a plurality of second cavity resonators arranged on the periphery of and magnetically coupled to said first cavity resonator and extending radially and symmetrically with respect to the axis of said first cavity resonator, each of said second cavity resonators having the same shape and size and each of said second cavity resonators comprising:

a cavity formed by a waveguide;

a first set of electrically conductive posts, arranged between said first cavity resonator and said cavity, for establishing magnetic-field coupling therebetween; and a second set of electrically conductive posts, arranged in the waveguide opposite said second set of electrically conductive posts; and a plurality of second conducting means having input ends operatively connected to the output terminals of said amplifying units, each of said second conducting means operatively coupled to a corresponding one of said second cavity resonators via said second set of electrically conductive posts in the corresponding one of said second cavity resonators, which establishes electromagnetic-field coupling therebetween, for conducting input signals of microwave electric power from said amplifying units into said second cavity resonators through the input ends of said second conducting means.

23. A microwave power amplifier as set forth in claim 22, wherein each of said second conducting means comprises said waveguide.

24. A microwave power amplifier as set forth in claim 22, wherein said first cavity resonator has a cylindrical shape.

25. A microwave power amplifier, comprising:

a plurality of amplifying units having output terminals; and a cavity resonator coupling-type power combiner, comprising:

a first conducting means, having an output end and an antenna, for providing output signals of microwave electric power;

a first cavity resonator, operatively coupled to the antenna of said first conducting means by electric-field coupling, having an axis and a symmetric shape with respect to the axis and resonating with a cylindrical $TM_{0,n,0}$ mode, where n is a positive integer;

a plurality of second cavity resonators arranged on the periphery of and magnetically coupled to said first cavity resonator and extending radially and symmetrically with respect to the axis of said first cavity resonator, each of said second cavity resonators having the same shape and size and each of said second cavity resonators comprising:

a cavity formed by a waveguide;

a window, formed between said first cavity resonator and said cavity, for establishing magnetic-field coupling therebetween; and a set of electrically conductive posts, arranged in the waveguide opposite said window; and a plurality of second conducting means having input ends operatively connected to the output terminals of said amplifying units, each of said second conducting means operatively coupled to a corresponding one of said second cavity resonators via said set of electrically conductive posts in the corresponding one of said second cavity resonators, which establishes electromagnetic-field coupling therebetween, for conducting input signals of microwave electric power from said amplifying units into said second cavity resonators through the input ends of said second conducting means.

26. A microwave power amplifier as set forth in claim 25, further comprising conductive lines, each of said conductive lines connected between said first cavity resonator and one of said second cavity resonators through said window of the one of said second cavity resonators, for adjusting the magnetic-field coupling.

27. A microwave power amplifier as set forth in claim 25, wherein said first cavity resonator has a cylindrical shape.

28. A microwave power amplifier, comprising:

a cavity resonator coupling-type power distributor, comprising:

first conducting means, having a first input end for receiving input signals of microwave electric power and a first antenna;

a first cavity resonator, operatively coupled to the first antenna of said first conducting means by electric-field coupling, having a first axis and a symmetric shape with respect to the first axis and resonating with a cylindrical $TM_{0,n,0}$ mode, where n is a positive integer;

a plurality of second cavity resonators arranged on the periphery of and magnetically coupled to said first cavity resonator and extending radially and symmetrically with respect to the first axis of said first cavity resonator, each of said second cavity resonators having the same shape and size; and a plurality of second conducting means having first output ends, each of said second conducting means operatively coupled to a corresponding one of said second cavity resonators, for conducting intermediate output signals of microwave electric power from said second cavity resonators to the first output ends of said second conducting means;

amplifying units, having input terminals operatively connected to the first output ends of said second conducting means, for receiving the intermediate output signals and having output terminals, said amplifying units amplifying the intermediate output signals to provide amplified signals of microwave electric power at the output terminals; and a cavity resonator coupling-type power combiner, comprising:

third conducting means, having a second output end for providing final output signals of microwave electric power and a second antenna a third cavity resonator, operatively coupled to the second antenna of said third conducting means by electric field coupling, having a second axis and a symmetric shape with respect to the second axis and resonating with a cylindrical $TM_{0,m,0}$ mode, where m is a positive integer;

a plurality of fourth cavity resonators arranged on the periphery of and magnetically coupled to said third cavity resonator and extending radially and symmetrically with respect to the second axis of said third cavity resonator, each of said fourth cavity resonators having the same shape and size; and a plurality of fourth conducting means having second input ends operatively connected to the output terminals of said amplifying units, each of said fourth conducting means operatively coupled to a corresponding one of said fourth cavity resonators, for conducting the amplified signals of microwave electric power from said amplifying units into said fourth cavity resonators through the second input ends of said fourth conducting means.

29. A microwave power amplifier as set forth in claim 28, wherein said first cavity resonator and said third cavity resonator have a cylindrical shape.

30. A microwave power amplifier as set forth in claim 28, wherein each of said second cavity resonators comprises:

a first cavity formed by a first waveguide;

a first window formed between said first cavity resonator and said first cavity, for establishing magnetic-field coupling therebetween; and a second window formed between said first cavity and the corresponding one of said second conducting means, for establishing electromagnetic-field coupling therebetween.

31. A microwave power amplifier as set forth in claim 30, wherein each of said second conducting means comprises said first waveguide which has a cross-sectional area larger than said first window and said second window.

32. A microwave power amplifier as set forth in claim 31, wherein each of said fourth cavity resonators comprises:

a second cavity formed by a second waveguide;

a third window formed between said third cavity resonator and said second cavity, for establishing magnetic-field coupling therebetween; and a fourth window formed between said second cavity and the corresponding one of said fourth conducting means, for establishing one of electric-field and magnetic-field coupling therebetween.

33. A microwave power amplifier as set forth in claim 32, wherein each of said fourth conducting means comprises said second waveguide which has a second cross-sectional area larger than said third window and said fourth window.

34. A microwave power amplifier as set forth in claim 28, wherein each of said second cavity resonators comprises:

a first cavity formed by a first waveguide;

a first set of electrically conductive posts, arranged between said first cavity resonator and said first cavity, for establishing magnetic-field coupling therebetween; and a second set of electrically conductive posts, arranged between said first cavity and the corresponding one of said second conducting means, for establishing electromagnetic-field coupling therebetween.

35. A microwave power amplifier as set forth in claim 34, wherein each of said second conducting means comprises said first waveguide.

36. A microwave power amplifier as set forth in claim 35, wherein each of said fourth cavity resonators comprises:

a second cavity formed by a waveguide;

a third set of electrically conductive posts, arranged between said third cavity resonator and said second cavity, for establishing magnetic-field coupling therebetween; and a fourth set of electrically conductive posts, arranged between said second cavity and the corresponding one of said fourth conducting means, for establishing electromagnetic-field coupling therebetween.

37. A microwave power amplifier as set forth in claim 36, wherein each of said fourth conducting means comprises said second waveguide.

* * * * *